United States Patent [19]

Schlangenotto et al.

[11] 3,906,545

[45] Sept. 16, 1975

[54] THYRISTOR STRUCTURE

[75] Inventors: Heinrich Schlangenotto, Neu-Isenburgh; Kurt Roy, Obertshausen, both of Germany

[73] Assignee: Licentia Patent-Verwaltungs-G.m.b.H., Frankfurt am Main, Germany

[22] Filed: Jan. 24, 1973

[21] Appl. No.: 326,275

[30] Foreign Application Priority Data

| | | |
|---|---|---|
| Jan. 24, 1972 | Germany | 2203156 |
| Apr. 6, 1972 | Germany | 2216494 |
| July 10, 1972 | Germany | 2233786 |
| Aug. 22, 1972 | Germany | 2241217 |

[52] U.S. Cl. .................. 357/38; 357/22; 357/37; 357/68; 357/88

[51] Int. Cl.$^2$ .................. H01L 29/74

[58] Field of Search.. 317/235 AB, 235 AM, 235 A; 357/22, 36, 37, 38, 68, 88, 89, 39

[56] References Cited

UNITED STATES PATENTS

| | | | |
|---|---|---|---|
| 2,994,121 | 8/1961 | Shockley | 29/25.3 |
| 3,341,749 | 9/1967 | Shields et al. | 317/234 |
| 3,349,299 | 10/1967 | Herlet | 317/235 |
| 3,381,187 | 4/1968 | Zuleeg | 317/235 |
| 3,411,054 | 11/1968 | Cullis | 317/235 |
| 3,455,748 | 7/1969 | Lindmayer et al. | 148/175 |
| 3,538,401 | 11/1970 | Chu | 317/235 |
| 3,579,060 | 5/1971 | Davis | 317/235 |
| 3,609,476 | 9/1971 | Storm | 317/235 |
| 3,611,066 | 10/1971 | Knaus | 317/235 |
| 3,663,873 | 5/1972 | Yagi | 317/235 |
| 3,725,753 | 4/1973 | Garrett | 317/235 |

FOREIGN PATENTS OR APPLICATIONS

| | | | |
|---|---|---|---|
| 948,239 | 1/1964 | United Kingdom | 317/235 A |
| 935,710 | 9/1963 | United Kingdom | |
| 1,164,465 | 9/1969 | United Kingdom | |
| 1,497,548 | 9/1967 | France | |

OTHER PUBLICATIONS

Proceedings of the 3rd Conference on Solid State Devices, Tokyo, Y. Terasawa, "Obs. of Plas. Sp. in H–S Thys. Using New Microwave Technique," pp. 198–204, 1971.

*Primary Examiner*—Andrew J. James
*Assistant Examiner*—Joseph E. Clawson, Jr.
*Attorney, Agent, or Firm*—Spencer & Kaye

[57] ABSTRACT

A thyristor device is formed by a semiconductor body having four zones of alternating conductivity types. The two outer zones anode and cathode, have a high conductivity and the two inner zones, base and gate (or control base), have a low conductivity. A contiguous control zone is disposed within the gate zone. The control zone is of the same conductivity type as the gate zone but has a higher conductivity. This control zone includes a plurality of narrow control paths which emanate from a control contact and spread over the entire cross-sectional area of the gate zone. The application of a control voltage between the control paths and the adjacent cathode zone provides for an increase in the switchon and the switch-through speeds.

15 Claims, 7 Drawing Figures

THYRISTOR STRUCTURE

BACKGROUND OF THE INVENTION

The present invention relates to a structural arrangement for improving the switching speed of a thyristor. More particularly the present invention relates to a thyristor which is formed in a semiconductor body with four layers, or zones, of alternating conductivity types, with the two outer zones, which constitute the anode and cathode side emitter zones, respectively, having a high conductivity value and the two inner zones, which constitute the base zones and control base zone, or gate zone, respectively, having a low conductivity value and wherein switch-on and the switch-through speeds occurring upon firing of the thyristor are increased by providing an arrangement which presents paths for conducting the control current to the gate zone in an efficient and rapid manner. The use of such paths, which conduct the control current, makes it possible even to switch off large-area thyristors by use of a control current.

In order to produce a high emitter efficiency, the anode and cathode side emitter zones in a thyristor of the type to which the present invention relates, and in particular in the case of a power thyristor, both have a conductivity which is much higher than the conductivity of the base and gate zones. Consequently, the gate zone exhibits a high shunt resistance to the control current which is applied.

Due to this high shunt resistance in the gate zone, only a narrow area which is disposed directly between the control contact and the cathode zone initially becomes current conducting when the thyristor is fired.

Various arrangements for modifying the zone structures have been provided in order to enlarge the above-mentioned area, which becomes current conducting when the thyristor is initially fired, in proportion to the current conducting cross section of the fully switched-through thyristor to thereby increase the switch-on and the switch-through speed of the thyristor. Some exemplary devices, in which the control contacts are arranged on the outer surface, are referred to by the following names: transverse field emitter, amplifying gate, trench gate and finger structure.

SUMMARY OF THE INVENTION

An object of the present invention is to provide an improved structural arrangement for a thyristor for causing the thyristor to be capable of being rapidly switched.

Another object of the present invention is to provide an improved thyristor structure which exhibits increased switch-on and switch-through speeds upon being fired.

A further object of the present invention is to provide an improved thyristor structure with increased switching speeds wherein even the areas far removed from the gate electrode immediately become current conducting upon firing of the thyristor.

These objectives are accomplished in accordance with the present invention by providing a contiguous control zone within the gate zone of the thyristor with the control zone being of the same conductivity type as the gate zone but more highly doped. This control zone is formed of a plurality of finger-like or net-like control paths which emanate from a control contact and extend over the entire cross-sectional area of the gate zone. The control zone can be disposed within the gate zone either on the border of at least one of the pn-junctions between the gate zone and the adjacent zones, i.e. the cathode zone and the base zone, or alternatively at a distance from both of these pn-junctions.

According to one embodiment of the present invention, the control zone includes a plurality of radially symmetrically extending finger-like control current paths which emanate from a centrally located control contact. This control zone is provided with a doping which is higher than the doping of the gate zone, for example by three orders of magnitude. Each of the control paths can be formed to branch out in the shape of an anchor at their ends. The width of these paths decrease in correspondence with the current load which decreases with increasing distance from the control contact.

These control paths are provided with such dimensions and doping concentrations that the voltage drop across the control paths when the control current passes through the control paths is smaller than roughly 50 mV at room temperature.

According to another embodiment of the present invention, the control zone includes first and second groups of linear control paths with the paths of the first group being arranged to intersect the paths of the second group at an angle. The paths of the two groups are interconnected at the points of intersection, thereby forming a net-like structure.

In a still further embodiment of the present invention, the control zone includes a plurality of finger-like first paths which emanates from a control contact and a plurality of second paths which form annular paths concentric with the control contact and intersect the first paths. The two groups of paths are interconnected at the points of intersection.

It is possible to modify any of the above embodiments by removing most or all of the cathode zone in the area directly above the control paths so that portions of the gate zone are exposed, or if the control path is on the border between the gate zone and the cathode zone then the control paths are exposed. It is also preferable in this type of embodiment for these exposed regions to be wider than the control paths. Such an arrangement provides improved control over the firing of the thyristor. In order to further ensure that the firing spreads uniformly over the lengths of these paths, the width of the exposed regions should decrease with increasing distance from the control contact.

As mentioned above, the control zone can be disposed on the border of at least one of the pn-junctions between the gate zone and the adjacent zones, cathode and base zone. Such a modification can be utilized in any of the above-described embodiments.

DESCRIPTION OF THE PREFERRED EMBODIMENTS

Figure 1:
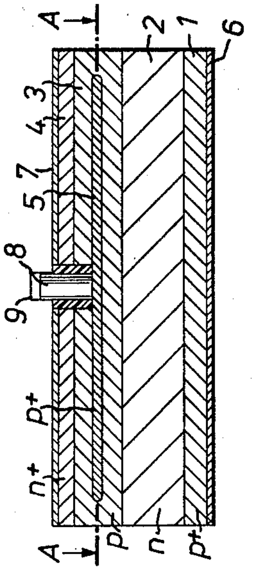
FIG. 1 shows a cross-sectional view of the zone structure of one embodiment of a thyristor according to the present invention in which the control current zone is disposed within the gate zone at a distance from the pn-junctions between the gate zone and the adjacent zones and in which the control zone includes a plurality of finger-like control paths.
Figure 2:
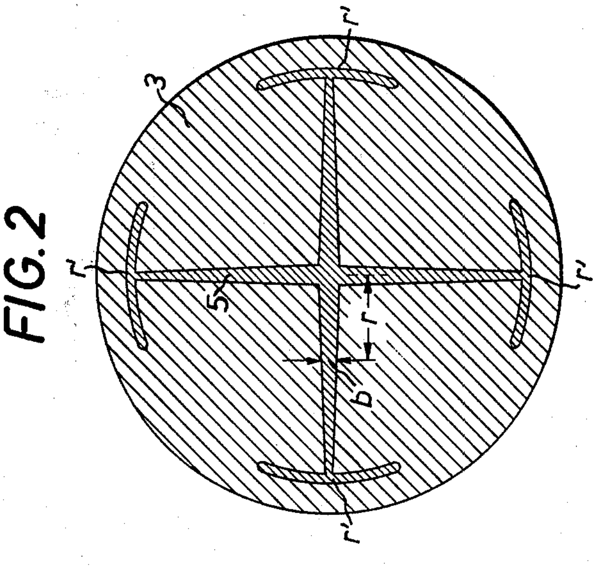
FIG. 2 is a longitudinal sectional view of the finger structure of the control paths shown in FIG. 1 along a line A-A passing through the control zone.

The thyristor shown in FIG. 1 has a semiconductor body with a $p^+ npn^+$ zone structure. The main electrodes 6 and 7 are applied to the outer $p^+$ and $n^+$ zones 1 and 4 respectively. The main electrode 6 covers the entire surface area of anode zone 1. The main electrode 7 covers the surface of cathode zone 4 and both electrode 7 and zone 4 have a circular ring shape with a central opening. Base zone 2 and gate, or control base, zone 3 are arranged between anode zone 1 and cathode zone 4. A contiguous p-conductive control current zone is disposed within the p-conductive gate zone 3, in approximately the center of the zone 3. This control zone longitudinally extends almost to the edge of the thyristor wafer in the form of a plurality of narrow control paths 5 so as to form the finger-like structure as shown in Fig. 2. The control zone is more highly doped than the gate zone 3. A control electrode 8 (i.e. a control contact), which is connected to the center of the control current paths 5, is centrally disposed within the thyristor and passes through the central opening in the cathode zone 4 and the main electrode 7, in an insulated manner, and through the gate zone 3 to control paths 5. A gate electrode 9 is connected to the control contact 8. The firing signal for the thyristor is applied to the gate electrode. The control current paths 5 have a thickness of about one third that of gate zone 3 and have a homogeneous acceptor concentration of, for example $10^{19}$ $cm^{-3}$. In comparison, the acceptor concentration in the gate zone 3 is, for example, only $10^{16}$ $cm^{-3}$. The distances between the control current paths 5 and the pn-junctions of the gate zone 3 to the cathode zone 4 and the base zone 2 are sufficiently large with these dimensions to provide the desired results.

The control current paths 5 as a whole together with the gate zone 3 and the outer $n^+$ zone 4 form a $p^+pn$ zone sequence which performs two functions. First the control paths 5 inject holes into gate zone 3 when a control voltage is applied between the gate zone 3, which is connected to the gate electrode via the control contact and the control paths, and the outer zone 4. This results in a corresponding increase in the concentration of electrons in the gate zone 3. Second, the control paths 5 conduct a control current emanating from the central control contact 8 to the edge of the gate zone 3 so that the necessary injection of holes is also provided even in the edge areas.

The intensity of the injection at any point along the finger-like control current paths 5 depends upon the size of the forward voltage present at the $p^+p$ junction. The injection causes the concentration of charge carriers to be increased to the greatest extent in the areas between the control current path 5 and the outer zone 4 and to the least extent in the center portion of the finger-like current paths 5 in the direction toward the inner base zone 2. The current path portions along the edges of the control current paths and the holes injected in the direction of the pn-junction formed between zones 2 and 3 are primarily effective in firing the thyristor. However, at a given voltage, when the width $b$ of the control current paths exceeds a width limit $b_o$, which limit depends on the doping concentration in the gate zone and on the geometric dimensions of the zones only the portion of the control current which is ineffective increases and no longer that portion of the current which contributes to the firing of the thyristor. Consequently, the width and the number of the control current paths 5 can be selected in order to set the size of the firing current. In practice, the width of each of the control paths will always be dimensioned very small with respect to the diameter of the semiconductor wafer. For example the width $b = 0.15$ mm and the diameter of the wafer is 30 mm.

In selecting the dimensions of the control current paths 5 care should also be taken to ensure that the injection of holes from the current path portions lying in the edge areas of the gate zone 3 is of sufficiently high intensity. Consequently the injection intensity should be maintained at a substantially constant level, i.e. there should be no significant decrease in its value, along the control current path with increasing distance $r$ from the control contact. It is advisable for this purpose to keep the voltage drop of the control voltage along the current paths at most in the order of magnitude of the voltage $$\frac{kT}{q},$$

i.e. at a maximum of about 25 mV at room temperature (where $k$ = Boltzmann constant, T = absolute temperature and $q$ = electronic charge).

With a given area $$\int_0^{r'} b\,dr$$

of a finger-like portion of the current path structure, the above-mentioned voltage drop can be reduced by decreasing the path width $b$ with increasing distance $r$ extending from the control contact in correspondence to the decreasing current load.

FIG. 2 which is a longitudinal section through the thyristor embodiment of FIG. 1, shows a star-shaped symmetrical structure with four finger-like control current paths 5 whose ends $r'$ are formed in the shape of anchors and whose center is connected with the control contact 8. Since the total area of the current paths 5 is small as compared to the cross-sectional area of the circular gate zone 3, only a slight portion of the total cross-sectional area conducting the anode current is eliminated from effective use after the firing and switching through of the thyristor.

A thyristor constructed according to the present invention has the advantage as compared to thyristors having an outer control contact of similar shape (finger gate, trench gate), that a comparable increase in the switch-on and switch-through speed can be obtained with a smaller total area for the control current paths than the corresponding area in the known control structures.

Figure 3:
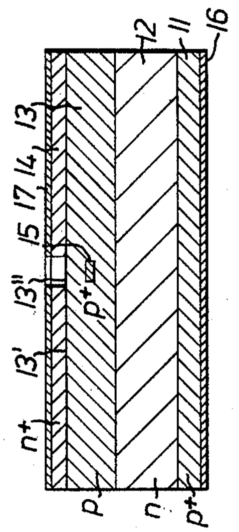
FIG. 3 is a cross-sectional view along the line B-B in FIG. 4 of another embodiment of the present invention with control paths similar to those in FIG. 1 but with all or at least most of the portion of the cathode zone directly above the control paths being removed so as to expose portions of the gate zone.
Figure 4:
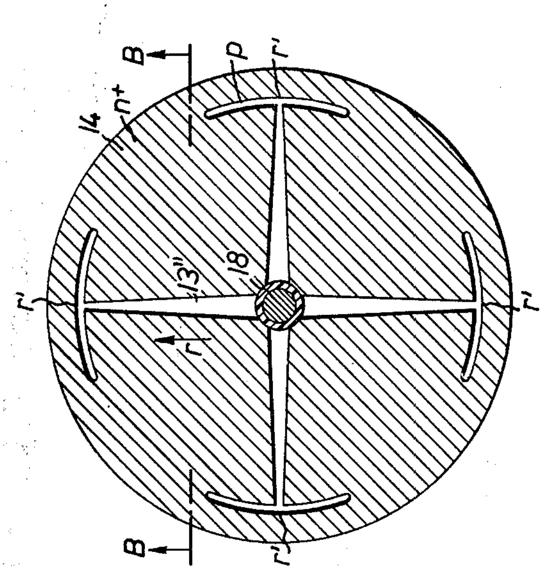
FIG. 4 is a top plan view of the embodiment of the thyristor of FIG. 3.

A second embodiment of a thyristor constructed according to the present invention is shown in FIGS. 3 and 4 and is similar to the thyristor embodiment shown in FIGS. 1 and 2; the difference between these two thyristor embodiments will be explained below.

FIG. 3 shows a cross-sectional view of the zone structure of a thyristor according to the present invention which is covered at its main surfaces with an anode contact 17, a cathode contact 16 and a centrally disposed control contact 18. The thyristor is formed by a semiconductor body with a $p^+npn^+$ zone sequence with an anode side $p^+$ emitter zone 11, an $n$-conductive base zone 12, a $p$-conductive gate, or control base, zone 13 and a cathode side $n^+$ emitter zone 14. The highly doped $p^+$ -conductive control current paths 15 are again disposed within the gate zone 13. The control paths 15 form a finger-like structure as shown in FIG. 4, which extends in a radially symmetrical pattern from the control contact 18. The ends $r'$ of the finger-like paths 5 are in the form of anchor-shaped branches.

In contrast to the thyristor shown in FIGS. 1 and 2, however, in the embodiment of the thyristor shown in FIGS. 3 and and 4, the gate zone 13 is not covered by the $n^+$ emitter zone 14 in its areas 13'' bordering the $n^+$ emitter zone which exposed areas are spaced a minimum distance from the control current paths 15. These exposed areas 13'' of the border surface of the gate zone are preferrably slightly wider than the control current paths 15. FIG. 4 shows that the electrode 17 and the $n^+$ emitter zone 14, therefore, have an opening with the same shape as the control current paths 15 through which the regions 13'' of the border surface 13' of the gate zone (FIG. 3) can be seen.

In the thyristor embodiment of FIGS. 3 and 4, upon the application of a control voltage between the control contact 18 and $n^+$ emitter zone 14, the charge carriers which are injected into the gate zone 13 by the $p^+$ doped control current path 15 are forced to flow with a lateral directional component toward the $n^+$ emitter. Such an arrangement enables a larger portion of the control current to contribute to the firing of the thyristor as compared to a thyristor with an uninterrupted $n^+$ cathode zone and the portion of the control current not effective in the firing of the thyristor is substantially reduced. By making more effective use of the control current the switching speed can be significantly increased.

As previously discussed it is desirable to construct the thyristor so that the firing uniformly spreads over the entire length of the control current paths. Since a voltage drop cannot be completely avoided by the control current along the highly doped $p^+$ conductive control current paths 15, the firing will always spread out somewhat more from the portions of the control current paths 15 which lie closer to control contact 18 even when the conditions are otherwise homogeneous and the control current is only slightly excessive. This lack of uniformity in the propagation of the firing can be prevented, however, according to the present invention, by constructing the width of the areas of the border surface of the gate zone 13 which are not covered by the cathode side $n^+$ emitter zone 14 so that they decrease with increasing the distance $r$ from the control contact 18, as shown in FIG. 4. Thus the distance between the control current paths 15 and the $n^+$ emitter zone 14 also decreases with increasing distance $r$ and consequently with a given control voltage the control current proportionately increases. However, since the control potential in the control current paths decreases with increasing the distance $r$ from the control contact due to the voltage drop when a control current is flowing, the width of the regions 13'' which are not covered by the $n^+$ emitter zone can be dimensioned so that the control current emanating from the various parts thereof is maintained at a constant level over the entire area or is so distributed that the firing is uniformly spread out.

Figure 5:
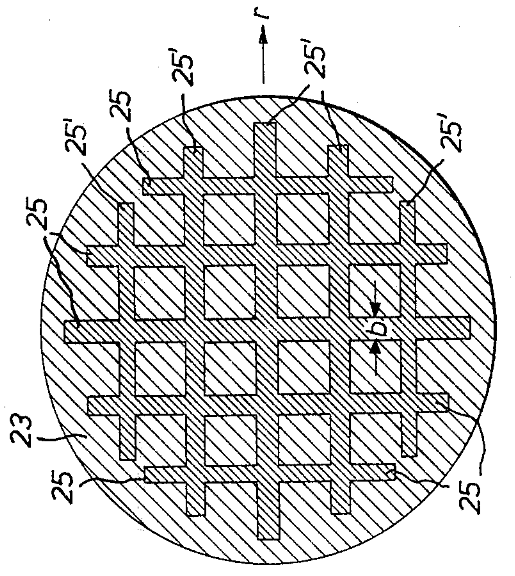
FIG. 5 is a longitudinal sectional view similar to that of FIG. 2 of an additional embodiment of the control paths according to the present invention.

FIG. 5 shows a further alternative embodiment for the formation of the control zone in accordance with the present invention. In FIG. 5 two groups of linear control current paths 25, 25' are disposed within the gate zone 23 and form a net-like structure. In the illustrated embodiment, these two groups of paths 25 and 25' each have five linear, parallel current path strips. The linear paths of each group are arranged to perpendicularly intersect the paths of the other group and the paths are interconnected at these points of intersection. The centrally disposed control contact of the thyristor is connected with the point of intersection of the two center current path strips of groups 25 and 25'. This control current path net-like structure extends over the entire cross-sectional area of the gate zone 23.

With the use of the above-described control current path structure shown in FIG. 5, almost the entire longitudinal sectional area of the thyristor which is available for current conduction is utilized during the firing process. In correspondence with the current load in the control current strips which decreases with increasing distance $r$ from the associated control contact, the control path strips may have $a$ width $b$ which decreases with increasing distance $r$.

A control current path net-like structure of the configuration shown in FIG. 5 can also be advantageously utilized in a thyristor in which the control contact is not centrally disposed. In such applications, the control contact is preferable also connected with the control paths at a point of intersection of two or more control current path strips.

Figure 6:
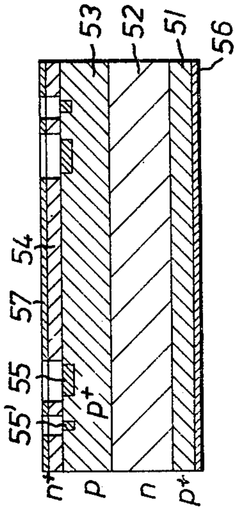
FIG. 6 is a cross-sectional view along line C—C of FIG. 7 showing a further embodiment of the thyristor of the present invention in which the control zone borders the pn-junction between the gate zone and the cathode zone and all or at least most of the portion of the cathode zone above the control paths is removed so as to expose portions of the control paths.
Figure 7:
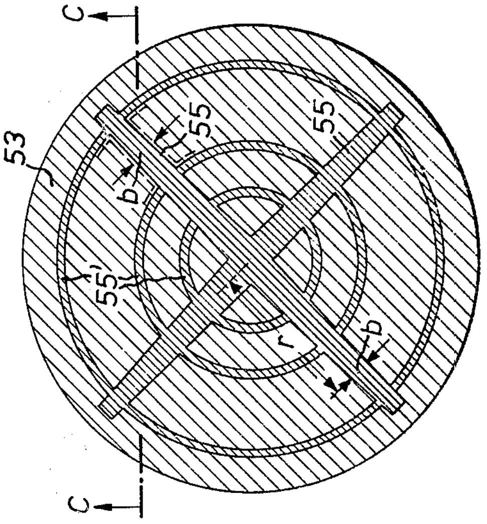
FIG. 7 is a longitudinal sectional view of the control paths of the thyristor of FIG. 6, with the section being taken along a line through the control paths.

A further modification of the thyristor constructed in accordance with the present invention would be to locate the control zone within the gate zone but along the border of at least one of the pn-junctions formed between the gate zone and the adjacent inner base and outer cathode zones. Such a modification will be discussed below with reference to FIGS. 6 and 7. This positioning of the control zone along the border of the pn-junction can be utilized in combination with any of the control path patterns shown above and can also be used with or without portions of the cathode zone being removed. FIGS. 6 and 7 illustrate a thyristor embodiment in which portions of the cathode zone are removed and a further embodiment for the pattern of the control paths is utilized. The control path pattern shown in FIGS. 6 and 7 also can be used in a thyristor embodiment in which the control zone is spaced from the respective *pn*-junctions, such as described above.

In the same manner as in the other thyristors previously discussed, the thyristor shown in FIGS. 6 and 7 has a $p^+ npn^+$ zone structure in which the outer $p^+$ zone 51 constitutes the anode side emitter zone, the outer $n^+$ zone 54 constitutes the cathode side emitter zone, the inner *p* zone 53 constitutes the gate, or control base, zone and inner n zone 52 constitutes the base zone. Main electrodes 56 and 57 are applied to the outer zones 51 and 54. The main electrode 56 covers the entire surface area of the anode zone. The main electrode 57 and the cathode zone 54 have a circular ring shape with a central opening within which a control electrode 58 is disposed which is attached to the gate zone 53 and is insulated from the cathode zone 54 and the electrode 57.

Four finger-like p-conductive control current paths 55 are disposed in the gate zone 53, adjacent the area of the *pn*-junction between the gate zone and the cathode zone 54. These control paths emanate from the associated control contact and extend almost to the edge of the thyristor wafer. As previously discussed, these control current paths 55 are more highly doped than the gate zone 53. The current paths 55 form a net-like structure with three current paths 55' which form trajectories around the control contact 58. These trajectories are in the form of annular paths which are concentric with the control contact 58. The circular, ring-shaped emitter zone 54 has openings of the same shape as the current paths 55 and 55' through which these current paths can be fully seen (see FIG. 7) since the opening is generally selected to be wider than the current paths, as previously discussed. The thickness of the current paths 55 is for example about one third that of the gate zone 53.

The control current path structure of FIG. 7 can be modified in that the control contact need not be centrally located. The control contact, however, would still be disposed at a point of intersection between two of the control current path strips. In another modification of the thyristor embodiment shown in FIG. 7, the control path net-like structure can consist of a first group of paths which radially emanated from the control contact and a second group of paths in the form of ellipses which are concentric with respect to the control contact and intersect the paths of the first group. These two groups of control paths are interconnected at their points of intersection.

The operation of the thyristor embodiment shown in FIGS. 6 and 7 is similar to the operation previously discussed with respect to the other embodiments.

A possible method for producing any of the various embodiments of the thyristor of the present invention, will be described below. A monocrystalline silicon disc which is initially doped with an *n*-type conductivity can be utilized to establish a pnp zone sequence either by a further doping process or by an epitaxy process. Thereafter, a portion of the *p*-conductive zone is etched away (in the embodiments where the control path is embedded in the gate zone) except for a remaining thickness of, for example, $30\mu$ and the layer is covered with a masking layer which is suitable for a subsequent borou diffusion. This masking layer is shaped to correspond to the intended structure of the control current paths. After the borium diffusion, or, if required, an appropriate ion implantation process, the diffusion treated p-conductive zone is rebuilt up to the desired thickness and finally in a further epitaxy step an $n^+$-conductive zone is produced on this *p*-conductive zone. An example of appropriate dimensions of the thyristor structure according to the present invention will be given now with reference to FIGS. 1 and 2:

Diameter of the semiconductor wafer: 30 mm
Thickness of the *p*-base gate zone: 35 $\mu$m
Width b of the $p^+$ control current paths: 100–150$\mu$m
Thickness of the $p^+$ control current paths: 15 $\mu$m
Capability of the initial rate of anode current $$\text{vise } \frac{di}{dt}: \quad > 300 \ \frac{A}{cm^2}.$$

The other dimensions can be chosen similarly to those in conventional SCR's.

It will be understood that the above description of the present invention is susceptible to various modifications, changes and adaptations, and the same are intended to be comprehended within the meaning and range of equivalents of the appended claims.

We claim:

1. In a thyristor having a semiconductor body with four zones of alternating conductivity types in which the two outer zones, being the anode and cathode zones respectively, are of a high conductivity and the two inner zones, being the base and the gate zones respectively, are of a low conductivity, the gate zone forms a separate pn-junction with each of the cathode and the base zones, the base zone forms a further *pn*-junction with the anode zone, and a gate electrode is coupled to the gate zone for supplying a signal thereto for firing the thyristor, the improvement wherein: a contiguous control zone which consists of semiconductor material of the same conductivity type as said gate zone but has a higher doping concentration than said gate zone, is disposed within said gate zone and has a plurality of interconnected narrow control paths which extend over the cross-sectional area of said gate zone, said control zone borders the pn-junction between the gate zone and said cathode zone; a control contact is ohmically connected to said control zone and to said gate electrode so that said gate electrode is ohmically connected to said gate zone via said control zone; said cathode zone covers at most only a portion of said control paths which border the area of the *pn*-junction between said gate zone and said cathode zone thus forming exposed regions of said control zone; said exposed regions are wider than said control current paths so that said exposed regions enclose the exposed portions of said control paths; and the width (*b*) of said exposed regions decreases with increasing distance (*r*) extending from said control contact.

2. In a thyristor having a semiconductor body with four zones of alternating conductivity types in which the two outer zones, being the anode and cathode zones respectively, are of a high conductivity and the two inner zones, being the base and the gate zones respectively, are of a low conductivity, the gate zone forms a separate pn-junction with each of the cathode and the base zones, the base zone forms a further pn-junction with the anode zone, and a gate electrode is coupled to the gate zone for supplying a signal thereto for firing the thyristor, the improvement wherein: a contiguous control zone is disposed within said gate zone and has a plurality of interconnected narrow control paths which extend over the cross-sectional area of said gate zone; said control zone consists of semiconductor material of the same conductivity type as said gate zone and has a higher doping concentration than said gate zone; a control contact is ohmically connected to said control zone and to said gate electrode so that said gate electrode is ohmically connected to said gate zone via said control zone; said control paths are dimensioned so that the maximum voltage drop across said control paths when a control pulse is applied to said gate electrode and the control current passes through said control paths is smaller than about 50mV at room temperature; and said control paths have a given area $$\int_0^{r'} b\,dr$$

with the width ($b$) of these paths decreasing in proportion to the current load which decreases with increasing distance ($r$) extending from said control contact.

3. A thyristor as defined in claim 1 wherein said control zone is disposed within said gate zone at a distance from each of the respective pn-junctions formed between said gate zone and said adjacent base and cathode zones.

4. A thyristor as defined in claim 3 wherein said cathode zone covers at most only a portion of the surface of said gate zone in the regions directly overlying said control paths, thus forming exposed regions of said gate zone, said exposed regions being at least as wide as said control paths.

5. A thyristor as defined in claim 4 wherein said cathode zone is provided with respective openings of the same shape as said control paths in the regions directly overlying said control paths, whereby the portions of said gate zone directly overlying said control paths are exposed.

6. A thyristor as defined in claim 5 wherein said control contact is centrally disposed in said control zone; and said control paths include a plurality of radially symmetrically extending finger-like paths emanating from said control contact.

7. A thyristor as defined in claim 2 wherein said control zone borders on the area of at least one of the *pn*-junctions between said gate zone and said adjacent base and cathode zones.

8. A thyristor as defined in claim 7 wherein said control zone borders the *pn*-junction between said gate zone and said cathode zone, said cathode zone covers at most only a portion of said control paths which border the area of the pn-junction between said gate zone and said cathode zone thus forming exposed regions of said control zone, said exposed regions being wider than said control current path so that said exposed regions enclose the exposed portions of said control paths.

9. A thyristor as defined in claim 8 wherein said cathode zone is provided with an opening of the same shape as said control zone whereby said control zone is entirely exposed within said opening.

10. A thyristor as defined in claim 2 wherein said control contact is centrally disposed in said control zone; said control paths include radially symmetrically extending finger-like paths emanating from said control contact with said decreasing width and having ends branching out in the form of anchors; and the doping concentration of said control zone is a few orders of magnitude higher than the doping concentration of said gate zone.

11. A thyristor as defined in claim 2 wherein said control paths include first and second groups of parallel linear paths, said linear paths of said first group are arranged to intersect said linear paths of said second group at an angle so as to form a net-like arrangement, and said paths are interconnected at the points of intersection.

12. A thyristor as defined in claim 2 wherein: said control paths are first paths emanating from said control contact; and said control zone includes second paths forming trajectories around said control contact and intersecting said first paths, said first and second paths being interconnected at the points of intersection.

13. A thyristor as defined in claim 2 wherein: said control contact is centrally disposed in said control zone said first paths are finger-like paths radially emanating from said control contact in a symmetrical manner; and said second paths are annular paths concentrically arranged with respect to said control contact.

14. In a thyristor having a semiconductor body with four zones of alternating conductivity types in which the two outer zones, being the anode and cathode zones respectively, are of a high conductivity, and the two inner zones being the base and the gate zones respectively are of a low conductivity, the gate zone forms a separate *pn*-junction with each of the cathode and the base zones, the base zone forms a further *pn*-junction with the anode zone, and a gate electrode is coupled to the gate zone for supplying a signal thereto for firing the thyristor, the improvement wherein: a contiguous control zone is disposed within said gate zone at a distance from each of the respective *pn*-junctions formed between said gate zone and said adjacent base and cathode zones and has a plurality of interconnected narrow control paths which extend over the cross-sectional area of said gate zone; said control zone consists of semiconductor material of the same conductivity type as said gate zone and has a higher doping concentration than said gate zone; a control contact is ohmically connected to said control zone and to said gate electrode so that said gate electrode is ohmically connected to said gate zone via said control zone; said cathode zone covers at most only a portion of the surface of said gate zone in the regions directly overlying said control paths, thus forming exposed regions of said gate zone; said exposed regions are at least as wide as said control paths; and the width ($b$) of said exposed regions decreases with increasing distance ($r$) extending from said control contact.

15. A thyristor as defined in claim 14 wherein said control paths are dimensionsed so that the maximum voltage drop across said control paths when a control pulse is applied to said gate electrode and the control current passes through said control paths is smaller than about 50mV at room temperature.

* * * * *